US006999352B2

(12) United States Patent
Yoshida et al.

(10) Patent No.: US 6,999,352 B2
(45) Date of Patent: Feb. 14, 2006

(54) DATA INVERSION CIRCUIT AND SEMICONDUCTOR DEVICE

(75) Inventors: Hiroyasu Yoshida, Tokyo (JP); Kanji Oishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 264 days.

(21) Appl. No.: 10/680,239

(22) Filed: Oct. 8, 2003

(65) Prior Publication Data

US 2004/0065904 A1 Apr. 8, 2004

(30) Foreign Application Priority Data

Oct. 8, 2002 (JP) ............................. 2002-294722

(51) Int. Cl.
*G11C 7/00* (2006.01)
(52) U.S. Cl. .................................. 365/189.05; 365/220
(58) Field of Classification Search ........... 365/189.05, 365/220, 189.01
See application file for complete search history.

(56) References Cited

U.S. PATENT DOCUMENTS 6,348,915 B1 * 2/2002 Yamashita et al. .......... 345/204

FOREIGN PATENT DOCUMENTS

| JP | 7-20973   | 1/1995 |
| JP | 8-101813  | 4/1996 |
| JP | 10-198475 | 7/1998 |

* cited by examiner

*Primary Examiner*—Vu A. Le
(74) *Attorney, Agent, or Firm*—Young & Thompson

(57) ABSTRACT

A parallel data outputting circuit equipped with a data inversion function, comprises P number of data comparator means, P number of majority decision circuits, P number of inversion flag generating means and P number of data inversion circuits, these being activated in parallel in one cycle. In generating an inversion flag indicating whether or not the parallel data are to be inverted and output in the inverted state, inversion flags are calculated from outputs of the inversion flag generating means and the inversion flag generating means of a cycle directly previous to a current cycle.

23 Claims, 8 Drawing Sheets

FIG. 6

| CYCLE | DATAR | DATAF | INVR | INVF | DATAINVR | DATAINVF | DINVR | DINVF | DQj | DQM |
|---|---|---|---|---|---|---|---|---|---|---|
| INITIAL STATE | | (00000000) | | | | | | (Low) | (00000000) | |
| Q0,Q1 | 11111111 | 00000000 | 11111111 | 11111111 | High | High | High | Low | 00000000 00000000 | High Low |
| Q2,Q3 | 11111111 | 00000000 | 11111111 | 11111111 | High | High | High | Low | 00000000 00000000 | High Low |

DATA INVERSION CIRCUIT AND SEMICONDUCTOR DEVICE

FIELD OF THE INVENTION

This invention relates to a data inversion circuit for temporally sequentially outputting multi-bit parallel data. More particularly, it relates to a data inversion circuit suitable for a read circuit of a clock synchronized semiconductor memory device, and to a semiconductor device employing the data inversion circuit.

BACKGROUND OF THE INVENTION

In an electronic device which outputs multi-bit data in parallel, the noise generated at the time of data transition poses a problem. This noise is produced most severely at the time of a transition corresponding to the switching of a CMOS logic circuit and the large amount of power is dissipated at the time of the transition. As a technique for reducing the number of transition times of the output data signals at the time of switching in a logic circuit, there is known a function of data inversion. This data inversion is of such a function in which data of a given cycle is compared to data output in a directly previous cycle and, in case the major part of the totality of N bits constituting the data, for example, N/2 bits or more, are switched, the logic of the data of the given cycle is inverted to output the resulting data, such as to reduce the number of bits of data actually switched on an external bus to N/2 bits or less, thereby reducing the noise or current consumption.

FIG. 8 depicts a representative configuration of a conventional data inversion circuit. The data inversion circuit shown in FIG. 8 is assumed to be employed, for example, in a clock synchronized semiconductor memory device equipped with a burst read operation. The data inversion circuit comprises a data comparator circuit 210, a majority decision circuit-data inversion flag generating circuit 310, a data inverting circuit 510 and a previous data holding circuit 810. Referring to FIG. 8, the operation of the data inversion circuit will be described step by step in the below.

1. The data comparator circuit 210 compares data 110 on the data bus to data 820 of the previous cycle, output from the previous data holding circuit 810, from one bit position to the next, and sets a bit-based comparison flag 220 for example to a high level, when the data has been switched from the last cycle.
2. The majority decision circuit-data inversion flag generating circuit 310 counts the number of the high-level comparison flag 220 and, when the data 110 has been switched at N/2 or more bit positions, an inversion flag 410 is set for example to a high level.
3. As long as the inversion flag 410 is set, the data inverting circuit 510 inverts the data 110 on the data bus to output the resulting data as output data 500.
4. The previous data holding circuit 810 holds actually output data 500.
5. During a burst read operation, the processing from 1 to 4 is repeated.

Meanwhile, the previous data holding circuit 810 is provided with a reset signal 830 for setting the previous data signal to the initial state such as a low level before start of read operation of the memory cell array.

By the above-described operation of the data inversion circuit, shown in FIG. 8, the number of inverted bits in the output data 500 is suppressed to N/2 bits or less, thereby to reduce the switching noise produced by an output circuit and to reduce the power dissipation.

There is a known a circuit configuration described in a reference 1 which compares (Ex-ORing) read data of a given cycle and read data of the directly previous cycle, a number of times equal to the number of bits, in an LSI chip, executes a majority decision of the number of changes in the value, and outputs an inverted (e.g. low-level) flag signal when the number of changes (the number of bits inverted from the read data of the last cycle) represents a majority, such as not less than N/2, while outputting reverse-phase data as output data. The result is that, if the number of the inverted bits is not less than one-half, reverse phase data may be output, whereby the number of bits inverted in the data output from the output buffer may be reduced to not larger than one-half. There is also a function of simultaneously outputting a flag signal, indicating the fact of inversion, to an external device, to advise the external device as to whether or not the output data has been inverted. Consequently, this technique belongs to the conventional circuit having a data inversion function as shown in FIG. 8.

Circuits having described in following references 2 and 3 which substantially have the object, effect and means for attaining the object in common with that of the reference 1, may be comprehended as belonging to the conventional technique shown in FIG. 8.

[reference 1]

JP Patent Kokai Publication JP-A-7-20973 (pages 2 to 4, FIG.)

[reference 2]

JP Patent Kokai Publication JP-A-8-101813 (page 3, FIG. 2)

[reference 3]

JP Patent Kokai Publication JP-A-10-198475 (page 4, FIG. 1)

SUMMARY OF THE DISCLOSURE

It should be noted that, when the conventional data inversion circuit is applied to a semiconductor device operating at a high speed clock rate, such as, for example, a double data rate synchronous dynamic random access memory (DDR-SDRAM), the following problem is encountered.

The DDR-SDRAM outputs data at both the rising edge and the falling edge of a clock signal during one cycle of the clock signal applied. Thus, in the circuit configuration shown in FIG. 8, decision on possible data inversion (data comparison, generation of an inversion flag signal and data inversion on a data bus) must be performed within one-half cycle of the clock signal. For example, if the clock signal has a frequency of 300 MHz, the time that may be used for giving a decision as to whether or not data inversion has occurred is approximately 1.67 ns. If the standard specifications for the width of the high level and the low level of the clock signal (for example 45% of a period) are also taken into account, the time allowed for giving a decision is 1.5 ns at the minimum, thus posing marked difficulties in timing designing.

Accordingly, it is an object of the present invention to provide a circuit for implementing the function of data inversion that may be applied to a semiconductor device outputting data for example, twice per clock cycle, that is, at the rising and falling edges of a clock signal, and to a semiconductor device effecting data inversion with the use of such data inversion circuit.

The above and other objects are attained by a semiconductor device in accordance with one aspect of the present invention, which has a data inversion function, in which data of a given cycle is compared with output data of a directly previous cycle to verify whether or not a majority in total bits constituting the data are switched and in which, when the majority number of bits of the data are switched, the data of said given cycle are inverted and the inverted data are output from a plurality of output terminals, said semiconductor device comprising:

a plurality of data comparator circuits, each being provided in associated one of a plurality of paths on which a plurality of data are transferred in parallel, with an output sequence from the output terminal between said plurality of data being predetermined, and comparing temporally before and after data;

a plurality of majority decision circuits, each receiving a plurality of comparison results which are output by the corresponding data comparator circuit, and the number of which corresponds to the number of said output terminals, and performing a majority decision of the comparison results received to output a decision result; and a plurality of inversion flag generating circuits, each receiving the decision result from the corresponding majority decision circuit and generating an inversion flag indicating that data is inverted and is output from said output terminals, based on the decision result.

The decisions of data inversion for a plurality of cycles are made in parallel.

According to the present invention, the semiconductor device preferably includes a plurality of the data comparator circuits, a plurality of the majority decision circuits and a plurality of the inversion flag generating circuits for a path on which data prescribed by the rising edge of double-rate clock signal is transferred and a path on which data prescribed by the falling edge of the double-rate clock signal is transferred.

A semiconductor device in accordance with another aspect of the present invention comprises:

a plurality of data output terminals;

first to P-th ports for one of said output terminals, for outputting, in parallel, first to P-th bit data to be output via said one data output terminal, where P is a predetermined integer not less than two, said first to the P-th bit data being output in this order via each data output terminal;

first to P-th data comparator circuits provided in association with said first to P-th ports, an i-th data comparator circuit of said data comparator circuits, where i is an integer from 1 to P, comparing data of the (i−1)st port, where if i=1, (i−1)st port is the P-th port or an initial value, with data of the i-th port to output an i-th comparison flag signal, first to P-th majority decision circuits provided in association with first to P-th data comparator circuits, the i-th majority decision circuit of said majority decision circuits, where i is an integer from 1 to P, receiving the i-th comparison signal, a number of which is equal to the number of the data output terminals of the semiconductor device and checking whether or not number of non-coincidence is the majority;

first to P-th inversion flag generating circuits provided in association with said majority decision circuits, the i-th inversion flag generating circuit of said first to P-th inversion flag generating circuits, where i is an integer from 1 to P, comparing an inversion flag signal of the (i−1)st one of said ports, where if i=1, (i−1)st port is the P-th port or an initial value, with the result of decision of the i-th majority decision circuit to output an i-th inversion flag signal; and first to P-th data inversion circuits for controlling inversion of associated data based on the associated inversion flag signal, the i-th data inversion circuit of said data inversion circuits, where i is an integer from 1 to P, inverting data on said i-th port, thereby for the inverted data to be output from said data output terminal, if said i-th inversion flag signal indicates the inversion.

According to the present invention, the data of the first to P-th ports are sequenced, for one data output terminal, in the order of the first port up to the P-th port, so that the data are serially converted and output.

A semiconductor device in accordance with another aspect of the present invention, in which data are output twice from one data terminal during each clock cycle, based on transition of the clock signal from a first logic value to a second logic value and from the second logic value to the first logic value. The semiconductor device comprises first and second data comparator circuits, which are connected to first and second paths, respectively. The data output on a first transition of the clock signal from the first logic value to the second logic value and on a second transition thereof from the second logic value to the first logic value are transmitted on the first and second paths, respectively. The first data comparator circuit verifies the presence or absence of data switching in the second transition directly previous to the first transition and in the first transition, based on verifying, by comparison, whether or not the data in a first transition timing of the clock signal on the first path is coincident with the data in a second transition timing of the clock signal on the second path directly previous to the first transition timing, and outputs the result of decision as a first output signal. The second data comparator circuit verifies the presence or absence of data switching in the first transition and in the second transition directly previous to the first transition, based on verifying, by comparison, whether or not the data in the first transition timing of the clock signal on the first path is coincident with the data in the second transition timing of the clock signal next following the first transition timing, and outputting the result of decision as a second output signal. The semiconductor device also comprises a first majority decision circuit receiving a set of first output signals a number of which is equal to the data terminals of the semiconductor device, output from the first data comparator circuits for verifying whether or not the majority of the data in the first group of the output signals have been switched to output a first check result signal, and a second majority decision circuit receiving a set of second output signals, a number of which is equal to the data output terminals of the semiconductor device, output from the second data comparator circuits for verifying whether or not the majority of the data in the second group of the output signals have been switched to output a second check result signal. The semiconductor device also comprises a first inversion flag generating circuit for generating a first inversion flag from the first decision result signal from the first majority decision circuit and from the value of a second inversion flag previous at least by one transition of the clock signal, a second inversion flag generating circuit for generating a second inversion flag from the second decision result signal from the second majority decision circuit and from the value of the first inversion flag previous at least by one transition of the clock signal, a first data inversion circuit for inverting the data of the first path and outputting the resulting inverted data if, based on the value of the first inversion flag, the first inversion flag indicates that the majority of the data have been switched, and a second data inversion circuit for inverting the data of the second path and outputting the resulting inverted data if, based on the value of the second inversion flag, the first inversion flag indicates that the majority of the data have been switched. The first and second inversion flag generating circuits output the first and second inversion flag signals, as flags indicating the inversion of the output data, from a control terminal of the semiconductor device.

According to the present invention, the first and second data comparator circuits and the first and second data inversion circuits in the semiconductor device are provided in a stage of a latch circuit unit provided on a data bus on which data of the first and second paths are transmitted to the output circuit.

According to the present invention, the semiconductor device preferably includes a parallel-to-serial conversion circuit receiving outputs from the first and second data inversion circuits in parallel, performing the parallel to serial conversion of the outputs and for outputting the resulting data, and an output buffer circuit supplied with output data from the parallel-to-serial conversion circuit for outputting the data from an output terminal.

According to the present invention, the latch circuit unit of the semiconductor device preferably includes first and second latch circuits connected to the first and second paths, respectively, and adapted for latching and outputting the first and second data, output to the first and second paths in parallel, with the first and second transitions of the first sampling clock signal respectively, a third latch circuit for sampling the output of the first latch circuit with one of the first and second transitions of the first sampling clock signal and for outputting the sampled signal with the other transition of the first sampling clock signal, a fourth latch circuit receiving an output of the second latch circuit and for latching and outputting the input signal with the one of the first and second transitions of the first sampling clock signal, a fifth latch circuit receiving an output of the fourth latch circuit and for latching and outputting the input signal with the one of the first and second transitions of the first sampling clock signal and a sixth latch circuit receiving an output of the fifth latch circuit and for latching and outputting the input signal with the other of the first and second transitions of the first sampling clock signal.

According to the present invention, the first data inversion circuit of the semiconductor device is preferably comprises a first selection circuit which receives an output of the third latch circuit and an inverted signal thereof, and which also is supplied with the first inversion flag signal, as a selection control signal, the first selection circuit outputting the inversion signal when the first inversion flag signal indicates inversion, while the second data inversion circuit thereof is formed by a second selection circuit which is supplied with an output of the sixth latch circuit and an inverted signal thereof, and which also is supplied with the second inversion flag signal, as a selection control signal, the second selection circuit outputting the inversion signal when the second inversion flag signal indicates inversion.

According to the present invention, the first data comparator circuit of the semiconductor device is supplied with data of the first path and with an output of the fourth latch circuit for detecting the coincidence thereof, while the second data comparator circuit is supplied with data of the first and second paths for detecting the coincidence thereof.

According to the present invention, the first inversion flag generating circuit of the semiconductor device includes a first comparator circuit for checking whether or not the first check result signal from the first majority decision circuit coincides with the inversion flag from the second inversion flag generating circuit, and a seventh latch circuit for sampling an output of the first comparator circuit with one of the first and second transitions of a second sampling clock signal and for outputting the sampled output with the other transition. The second inversion flag generating circuit includes an eighth latch circuit for latching and outputting the second check result signal from the second majority decision circuit with the other of the first and second transitions of the sampling second clock signals, a second comparator circuit for verifying whether or not the first inversion flag from the first inversion flag generating circuit is coincident with an output of the eighth latch circuit, and a ninth latch circuit for sampling an output of the eighth comparator circuit with one of the first and second transitions of the sampling second clock signals and for outputting the sampled output with the other transition.

According to the present invention, the semiconductor device may further comprise means for resetting the fourth latch circuit. Moreover, according to the present invention, the semiconductor device may further comprise means for resetting the ninth latch circuit.

According to the present invention, the first and second clock signals in the semiconductor device are preferably generated by clock signals supplied from outside the semiconductor device to the semiconductor device and are synchronized with each other.

According to the present invention, the semiconductor device may further comprise a clock synchronized type semiconductor memory for outputting read data from a cell array at a timing of a rising edge and a falling edge of a clock signal, wherein read data from the cell array of the semiconductor memories is output at a rising edge and at a falling edge of the clock signal.

A data inversion circuit for outputting parallel data composed by N bits, where N is an integer not less than two, in accordance with another aspect of the present invention, preferably comprises:

N sets of first to P-th data comparator means, in association with said N bits, said first to P-th data comparator means classifying said parallel data into P sets of parallel data neighboring to one another in the outputting timing sequence, P being an integer not less than two, said first to P-th data comparator means comparing the logic value of each of the first to P-th parallel data with the logic value of the parallel data to be output temporally directly previously to said first to P-th parallel data, at the same bit positions as those of the first to P-th parallel data, and outputting a comparison result as a logic value indicating coincidence or non-coincidence;

first to P-th majority decision means, p-th majority decision means of said majority decision means, where p is an integer from not less than 1 to not larger than P, verifying whether or not the number of non-coincident ones of N logic values output from said P-th data comparator means of one of said N sets is larger than a preset number and outputting a decision result as a logic value;

first to P-th inversion flag generating means, p-th majority decision means of said inversion flag generating means, where p is an integer from not less than 1 to not larger than P, deciding whether or not there is a coincidence of an output logic value of the (p−1)st inversion flag with an output logic value of said p-th majority decision means, and outputting the logic value of the decision result as a p-th inversion flag;

data holding means holding output logic value of said P-th inversion flag generating means;

said first inversion flag generating means deciding whether or not there is a coincidence of an output logic value of said P-th inversion flag generating means, held by the data holding means, with an output logic value of said first majority decision means, and outputting the logic value of the decision result as a first inversion flag;

N sets of first to P-th data inversion means, in association with said N bits, said first to P-th data inversion means inverting the logic values in respective bit positions of said first to P-th parallel data responsive to said first to P-th inversion flags;

flag outputting means, receiving said first to P-th inversion flags in parallel output from said first to P-th inversion flag generating means and performing parallel to serial conversion of said inversion flags received to output serially the resultant inversion flag signal in a predetermined timing sequence; and N sets of data outputting means, in association with said N bits, each data outputting means performing receiving output data signals in parallel from said first to P-th data inverting means and performing parallel to serial conversion of the signals received to output the resulting output data from the associated output terminal synchronized with the timing sequence of said inversion flags output by said flag outputting means.

According to the present invention, at least one of the data comparator means, majority decision means, inversion flag generating means, data inverting means, flag outputting means and the data outputting means is operated in synchronism with a clock signal and data is output from the data outputting means in synchronism with the clock signals and data outputting of the flag outputting means synchronized with the clock signals.

According to the present invention, at least one of data comparator means, majority decision means, inversion flag generating means, data inverting means, flag outputting means and the data outputting means is operated in synchronism with a rising and a falling of a clock signal and data is output from the data outputting means in synchronism with the clock signals and with data outputting of the flag outputting means synchronized with the rising and the falling of the clock signals.

According to the present invention, data output from the flag outputting means includes the information as to whether or not the data output from the data outputting means is the original data which is supplied to the data inversion circuit and the logic value of which has been inverted.

According to the present invention, P is preferably 2 or 4. Additionally, according to the present invention, the preset number is N/2 or an integer in the neighborhood thereof.

The semiconductor device according to the present invention may include a data inversion circuit according to the present invention.

According to the present invention, the semiconductor device may include a data inversion circuit wherein a plural number of data read at a time by a pre-fetch operation from a memory array are separated into data associated with the rising of the clock signal and data associated with the falling thereof, and are supplied in this state, with P being equal to 2.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 6 depicts examples of data changes of respective signals in the data inversion circuit according to the first embodiment of the present invention.

PREFERRED EMBODIMENTS OF THE INVENTION

Figure 1:
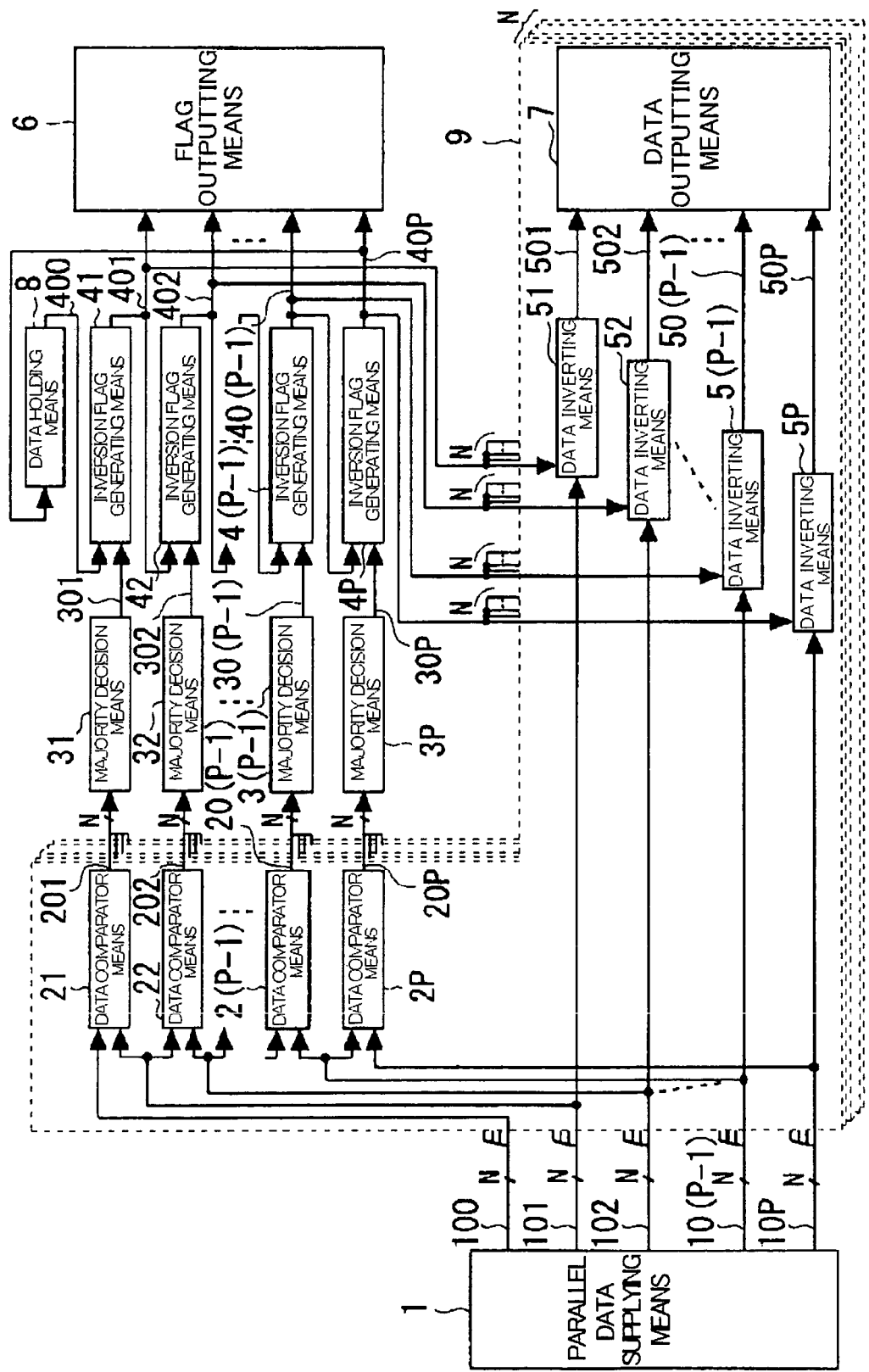
FIG. 1 is a block diagram showing a configuration of a data inversion circuit embodying the present invention.

Referring to the drawings, preferred embodiments of the present invention will be described in detail.

FIG. 1 depicts a block diagram showing the configuration of a data inversion circuit according to an embodiment of the present invention. Referring to FIG. 1, the data inversion circuit includes data comparator means 21, 22, . . . , and 2P, majority decision means 31, 32, . . . , and 3P, inversion flag generating means 41, 42, . . . , and 4P, data inverting means 51, 52, . . . , and 5P, flag outputting means 6, data outputting means 7 and data holding means 8. In the present embodiment, P is an integer not less than 2.

Meanwhile, data read means 9, composed of the data comparator means 21, 22, . . . , and 2P, the data inverting means 51, 52, . . . , and 5P and the data outputting means 7, is provided in association with a predetermined one bit of parallel data made up by N bits, where N is an integer not less than 2.

N-bit parallel data 10k, where k denotes an integer from 1 to P, output from a parallel data supplying means 1, are supplied to the corresponding data inverting means 5k, data comparator means 2k and to data comparator means 2(k+1). However, the parallel data 10P, supplied to the data inverting means 5P, are also supplied to the data comparator means 2P. Moreover, the parallel data 100 are supplied to the data comparator means 21.

It should be noted that the smaller the suffix k of the parallel data 10k, the earlier is the time at which the parallel data is output from the data outputting means 7, and that the parallel data 100 is of the same data contents as the parallel data 10P in the temporally directly previous P parallel data.

The data comparator means 2k compares logic values of corresponding bit positions of the parallel data 10k and the parallel data 10(k−1) and outputs a state of whether or not the logic values coincide with each other by a logic value 20k.

The majority decision means 3k receives the logic values 20k for N bits and decides whether or not the number of non-coincidences in the N logic values 20k is larger than a preset number to output the result of the decision as a logic values 30k. This preset number here is e.g. N/2 or an integer value in its vicinity.

The inversion flag generating means 4k checks the coincidence between the output logic value of the (k−1)st inversion flag 40(k−1) and the logic value 30k output from the kth majority decision means 3k to output the logic values of the results of check as the kth inversion flag 40k. It should be noted that the inversion flag 400 is output from the data holding means 8, and that the data holding means 8 holds the inversion flag 40P output from the inversion flag generating means 4P to output the so held contents as the inversion flag 400.

The data inverting means 5k performs the inversion of logic values of corresponding bits of the parallel data 10k, by way of logic negation, depending on the inversion flag 40k, and outputs the result as an output 50k.

The flag outputting means 6 outputs the inversion flag 40k. For example, the flag outputting means 6 arrays serially in a timing sequence the inversion flags which are entered in parallel, to output the inversion flags at an output terminal synchronized with a preset clock signal, not The data outputting means 7, which sends out the outputs 50k, is designed to array the outputs 50k, entered e.g. in parallel, in timing sequence, to send out these outputs serially at an output terminal in synchronism with a preset clock signal, not shown.

In a data inversion circuit according to an embodiment of the present invention, as described above, the parallel N-bit data 10k, output from the parallel data supplying means 1, are arrayed chronologically and compared to the parallel data of the directly previous cycle. If the majority of bits, for example, not less than N/2 bits or not less than an integer ahead or in rear of N/2, are inverted, the parallel data of the cycle in question are output as the logic state thereof is inverted. This suppresses the number of bits of data inverted at the time of outputting to e.g. an external bus by the data outputting means 7 to not larger than N/2 or an integer ahead or in rear of N/2 to reduce the noise generated by the outputting circuit and the current consumption.

There are P each of the data comparator means 21, 22, . . . , and 2P, majority decision means 31, 32, . . . , and 3P, inversion flag generating means 41, 42, . . . , and 4P and the data inverting means 51, 52, . . . , and 5P, these operating in parallel in one cycle. This assures facilitated timing designing in implementing the data inversion circuit which is in operation in stability even if the operating frequency is increased.

In generating the inversion flag 40k, in a data inversion circuit according to an embodiment of the present invention, inversion flags 401, 402, . . . , and 40P are calculated from the outputs of inversion flag generating means 41, 42, . . . , and 4P and the outputs of the inversion flag generating means 4P of the cycle directly previous to the cycle in question, instead of comparing the data of a cycle directly previous to the cycle in question, actually output from the data inversion circuit, to the parallel data of the cycle in question, and generating the inversion flag 40k from the result of the majority decision. This assures facilitated designing of the timings in implementing the data inversion circuit which is in operation in stability even if the operating frequency is increased.

More detailed description will be done in the below as to an embodiment of the present invention in which the invention is applied to the cases where P=2 and P=4. In the description, the signal name with the suffix_B, such as a signal XYZ_B, designates an inverted signal (complemented signal) of the signal XYZ. A terminal name/A denotes a terminal in which an inverted signal of a signal A is received or output.

[Embodiment 1]

Figure 2:
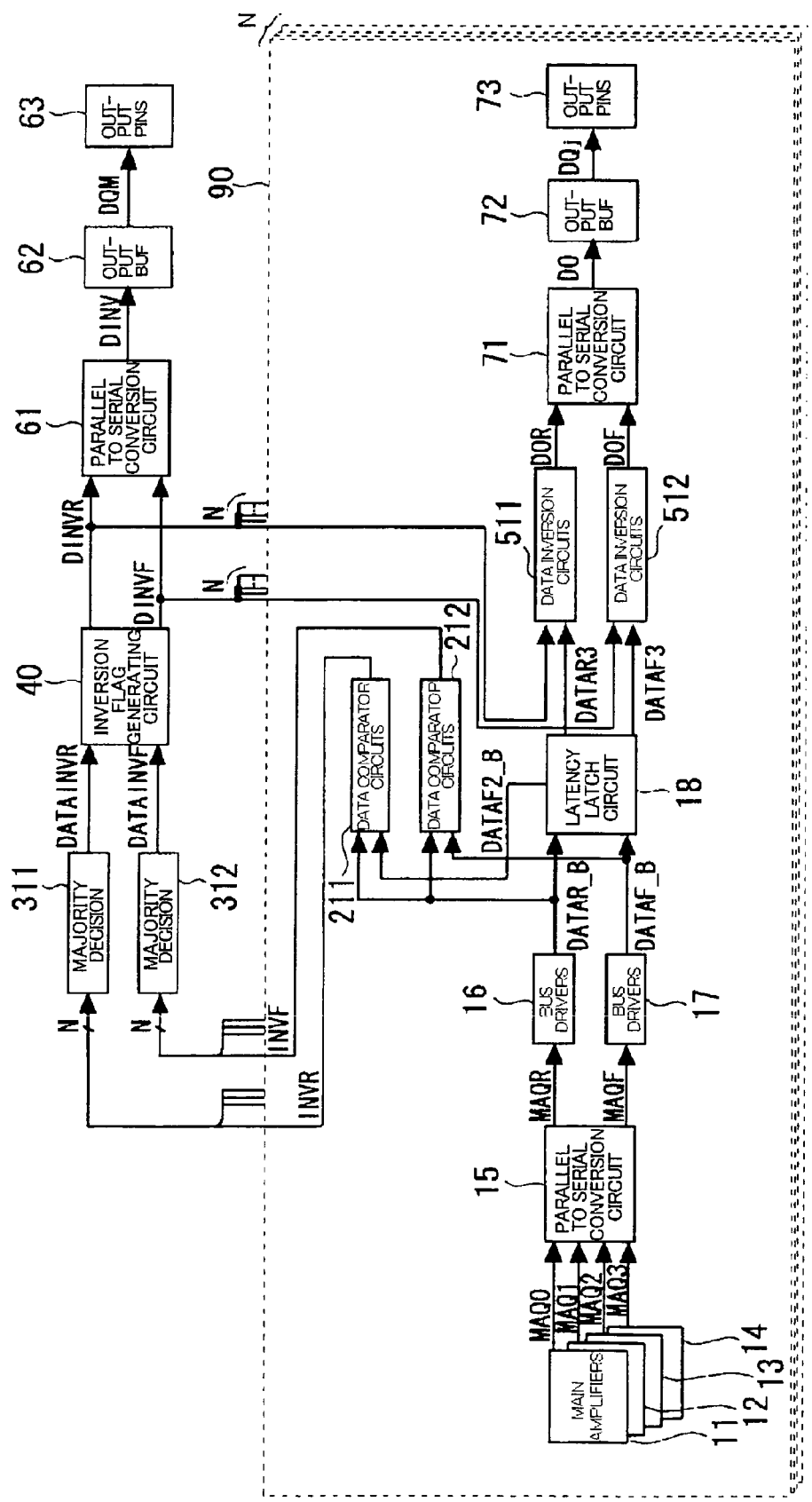
FIG. 2 is a block diagram showing a configuration of a data inversion circuit according to a first embodiment of the present invention.

FIG. 2 is a block diagram showing the configuration of a data inversion circuit according to a first embodiment of the present invention, where P=2. Referring to FIG. 2, the data inversion circuit according to the first embodiment of the present invention comprises main amplifiers 11 to 14, a parallel-to-serial conversion circuits 15, bus drivers 16 and 17, a latency latch circuit 18, data comparator circuits 211 and 212, majority decision circuits 311 and 312, an inversion flag generating circuit 40, data inversion circuits 511 and 512, parallel to serial conversion circuits 61 and 71, output buffer circuits 62 and 72, and output pins 63 and 73.

Meanwhile, a data read unit 90, which is composed by the main amplifiers 11 to 14, parallel-to-serial conversion circuit 15, bus drivers 16 and 17, latency latch circuit 18, data comparator circuits 211 and 212, data inversion circuits 511 and 512 parallel to serial conversion circuit 71, output buffer circuit 72 and the output pin 73, is provided in association with a preset one bit of N-bit parallel data, where N is an integer not less than 2.

Four data, read at a time from a memory array, not shown, by e.g. a pre-fetch operation, are amplified by the main amplifiers 11 to 14, so as to be output as signals MAQ0, MAQ1, MAQ2 and MAQ3, respectively. The parallel-to-serial conversion circuit 15 performs the parallel-to-serial conversion of e.g. the signals MAQ0 and MAQ2 into data MAQR which is associated with a rising side of a clock signal, not shown, while performing the parallel-to-serial conversion of e.g. the signals MAQ1 and MAQ3 into data MAQF associated with a falling side of the clock signal. The bus drivers 16 and 17 send out the data MAQR, MAQF as data signals DATAR_B and DATAF_B, respectively.

The data signals DATAR_B and DATAF_B are supplied to the latency latch circuit 18 and to the data comparator circuits 211 and 212. The latency latch circuit 18 delays the data signal DATAR_B and outputs a data signal DATAR3 at a preset timing to the data inversion circuit 511. The latency latch circuit 18 delays the data signal DATAF_B and outputs a data signal DATAF2_B at a preset timing to the data comparator circuit 211, while outputting the data signal DARAF3 at a preset timing to the data inversion circuit 512.

The data comparator circuit 211 compares the data signal DATAR_B on the rising side of a cycle to the data signal DATAF2_B on the falling side in the previous cycle, output by the latency latch circuit 18, by Ex-OR, to output a rising side comparison signal INVR. The data comparator circuit 212 compares the data signal DATAF_B on the falling side of the cycle in question to the data signal DATAR_B on the rising side of the cycle in question to output a falling side comparison signal INVF.

The signals INVR and INVF respectively indicate whether or not there occurs data switching. Should there be data switching, the comparison signals INVR and INVF at a high level are output.

N number of comparison signals INVR are supplied to the majority decision circuit 311 of the rising side, whilst N number of comparison signals INVF are supplied to the majority decision circuit 312 of the falling side. The majority decision circuit 311 determines whether or not more than half the input data have been switched, that is whether or not the number of the high-level comparison signals INVR is not less than N/2, and outputs a majority decision signal DATAINVR representing the result of decision. The majority decision circuit 312 determines whether or not more than half the input data have been switched, that is whether or not the number of the high-level comparison signals INVF is not less than N/2, and outputs a majority decision signal DATA-INVF representing the result of decision. If one-half or more of the data have been switched, the majority decision signals DATAINVR, DATAINVF are set to a high level. The majority decision signals DATAINVR and DATAINVF are sent to the inversion flag generating circuit 40.

In the inversion flag generating circuit 40, the rising side inversion flag signal DINV is generated by processing, by e.g. Ex-OR, the rising side majority decision signal DATA-INVR of the current cycle (cycle in question) and the falling side inversion flag signal DINVF of the directly previous cycle. On the other hand, the falling side inversion flag signal DINV is generated by processing, by e.g. Ex-OR, the falling side majority decision signal DATAINVF of the current cycle and the rising side inversion flag signal DINVR of the current cycle The reason why the majority decision signal DATAINVR and DATAINVF are processed with e.g. Ex-OR with the inversion flag signals DINVR and DINVF is that the data being processed e.g., with data comparison are data on the inner data bus and not data actually output to outside via output pin 73. For example, if a decision to the effect that more than one-half of data have been switched is issued by the majority decision circuits one after the other, the latter data must be output without inversion from the output pin.

On the other hand, the inversion flag signal DINVR is supplied to the data inversion circuit 511, while the inversion flag signal DINVF is supplied to the data inversion circuit 512. When the inversion flag signal DINVR is high, that is, when one-half or more data have been switched, the data inversion circuit 511 inverts data of the data signal DATAR3 and then supplies the inverted data to the parallel to serial conversion circuit 71, whereas, if the inversion flag signal DINVR is low, that is when less than one-half data have been switched, the data inversion circuit 511 supplies data of the data signal DATAR3, without inversion, to the parallel to serial conversion circuit 71. In both of these cases, the data signal from the data inversion circuit 511 is output as an output data signal DOR.

When the inversion flag signal DINVF is high, that is, when one-half or more data have been switched, the data inversion circuit 512 inverts data of the data signal DATAF3 and supplies the inverted data to the parallel to serial conversion circuit 71, whereas, if the inversion flag signal DINVF is low, that is when less than one-half data have been switched, the data inversion circuit 512 supplies data of the data signal DATAF3, without inversion, to the parallel to serial conversion circuit 71. In both of these cases, the data signal from the data inversion circuit 512 is output as an output data signal DOF. Meanwhile, as the circuit for inverting the output data based on the logic value of the inversion flag, an Ex-OR circuit which receives the data signals and the inversion flag may be used.

The parallel to serial conversion circuit 71 performs parallel to serial conversion of the output data signal DOR for the rising data and the output data signal DOF for the falling data to send out the resulting signals in the timing sequence to the output buffer circuit 72 as the signal DO. The output buffer circuit 72 amplifies the signal DO to output the amplified signal from the output pin 73 as a signal DQj (j=1 to N).

On the other hand, the inversion flag signals DINVR and DINVF are supplied to the parallel to serial conversion circuit 61 so as to be supplied as a signal DINV in the timing serial sequence to the output buffer circuit 62. The output buffer circuit 62 amplifies the signal DINV to output the amplified signal as signal DQM from the output pin 63. Meanwhile, the signal DINV is output as it is synchronized with the corresponding signal DO.

Figure 3:
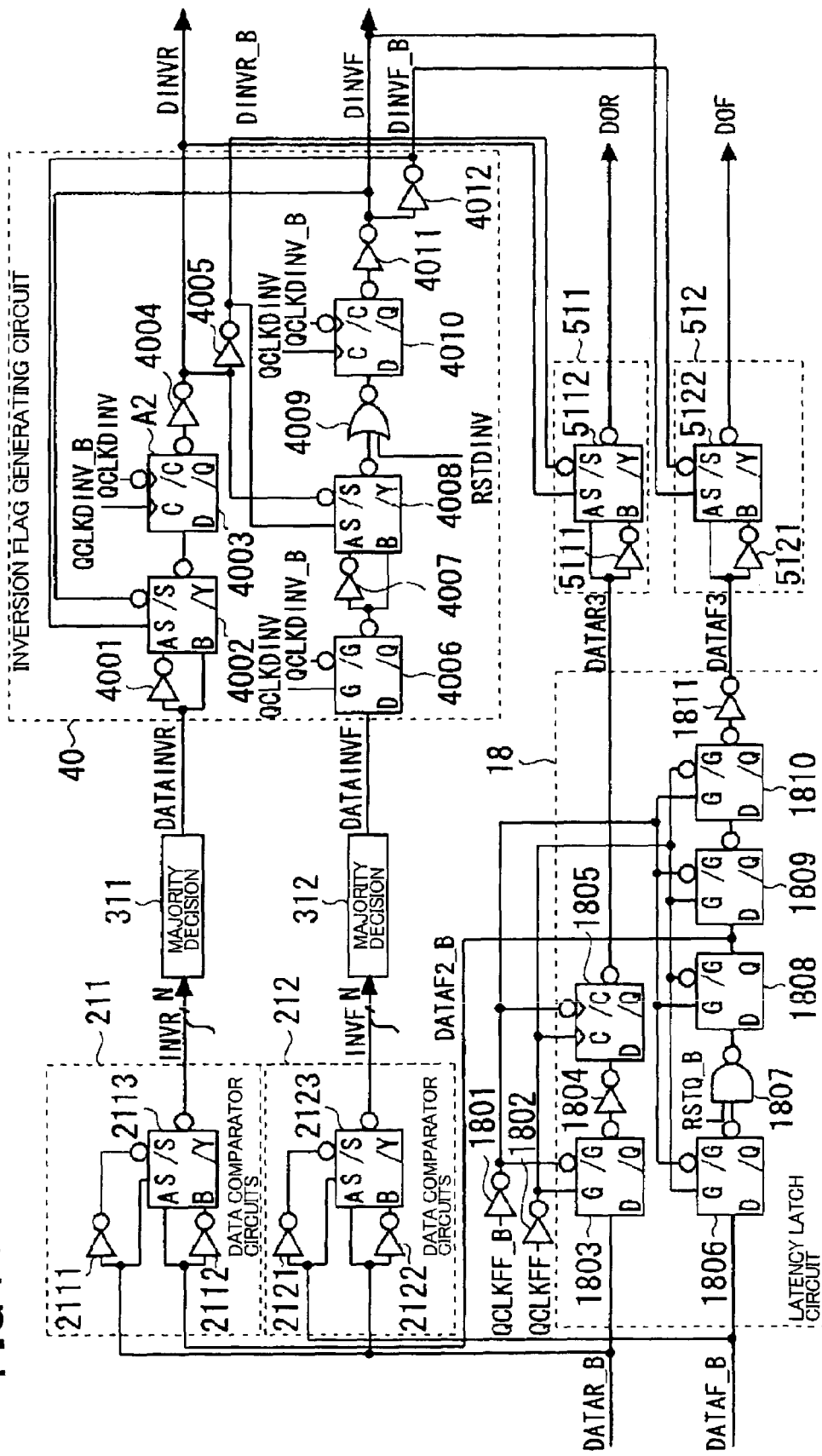
FIG. 3 is a block circuit diagram showing essential portions of the data inversion circuit according to a first embodiment of the present invention.

The latency latch circuit 18, data comparator circuits 211 and 212, inversion flag generating circuit 40 and the data inversion circuits 511 and 512, as essential portions of the above-described first embodiment, will now be described in detail. FIG. 3 is a block circuit diagram showing major portions according to the first embodiment of the present invention. FIG. 4 depicts an equivalent circuit configuration of circuit symbols used in FIG. 3.

Figure 4A:
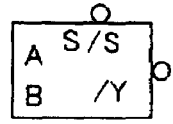
FIGS. 4A, 4B, 4C and 4D depicts equivalent circuits of circuit symbols shown in FIG. 3.
Figure 4A:
Figure 4A:
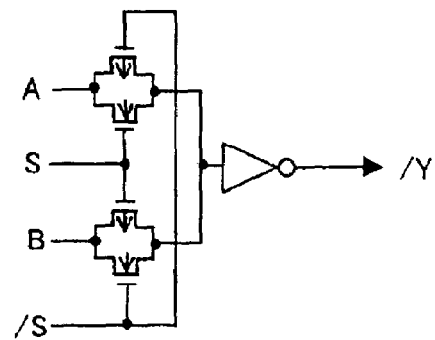

In FIG. 3, reference numerals 1801, 1802, 1804, 1811, 2111, 2112, 2121, 2122, 4001, 4004, 4005, 4007, 4011, 4012, 5111 and 5121 denote inverter circuits. A reference numeral 1807 denotes a NAND circuit, and a reference numeral 4009 denotes a NOR circuit. Reference numerals 2113, 2123, 4002, 4008, 5112 and 5122 are selection circuits, the equivalent circuit of which is shown in FIG. 4A. The selection circuit receives two input signals from input terminals A and B and receives complementary selection control signal from terminals S and /S and output a selected signal from an output terminal /Y, in which when the terminal S is high, the signal supplied to the terminal A is selected and the signal fed to the terminal A is inverted and output from the terminal /Y, while when the terminal S is low, the signal supplied to the terminal B is selected and the signal fed to the terminal B is inverted and output from the terminal /Y.

Figure 4B:
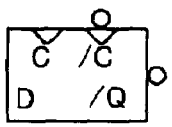
Figure 4B:
Figure 4B:
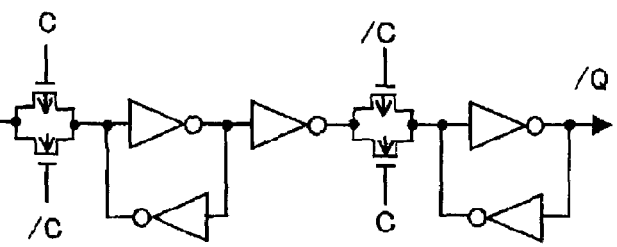
Figure 4C:
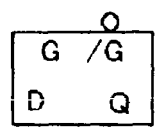
Figure 4C:
Figure 4C:
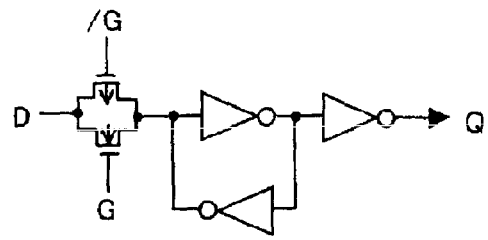
Figure 4D:
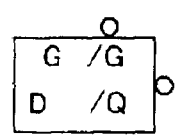
Figure 4D:
Figure 4D:
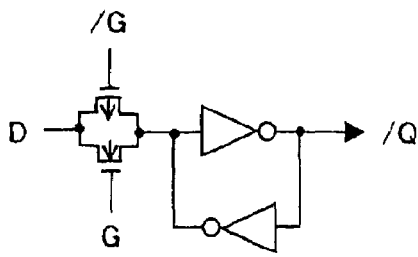

Reference numerals 1805, 4003 and 4010 are edge triggered D-flip-flop (D register) circuits, the equivalent circuit of which is shown in FIG. 4B. A reference numeral 1808 is a D-latch circuit(level sensitive latch), the equivalent circuit of which are shown in FIG. 4C. Reference numerals 1803, 1806, 1809, 1810 and 4006 are D-latch circuits, outputting the inverting output signal(/Q), and the equivalent circuit of which is shown in FIG. 4D. The D-flip-flop and D-latch circuits shown in FIGS. 4B–4D are well known and the description of the configurations and operations thereof is omitted.

It is noted that the signals QCLKFF and QCLKFF_B are clock signals which are opposite in phase to each other, while the signals QCLKDINV and QCLKDINV_B are clock signals which are opposite in phase to each other. These clock signals are synchronized with the clock signals (CLK), not shown, supplied from outside the data inversion circuit.

It is noted that a signal RSTQ_B is a reset signal for initializing the latency latch circuit 18, while a signal RSTDINV is a reset signal for initializing the inversion flag generating circuit 40.

The inverter 2111, 2112, 2121, 2122, 4001, 4004, 4005, 4007, 4012, 5111 and 5121 generate inversion signals which are needed in respective destinations of connection thereof.

Figure 5:
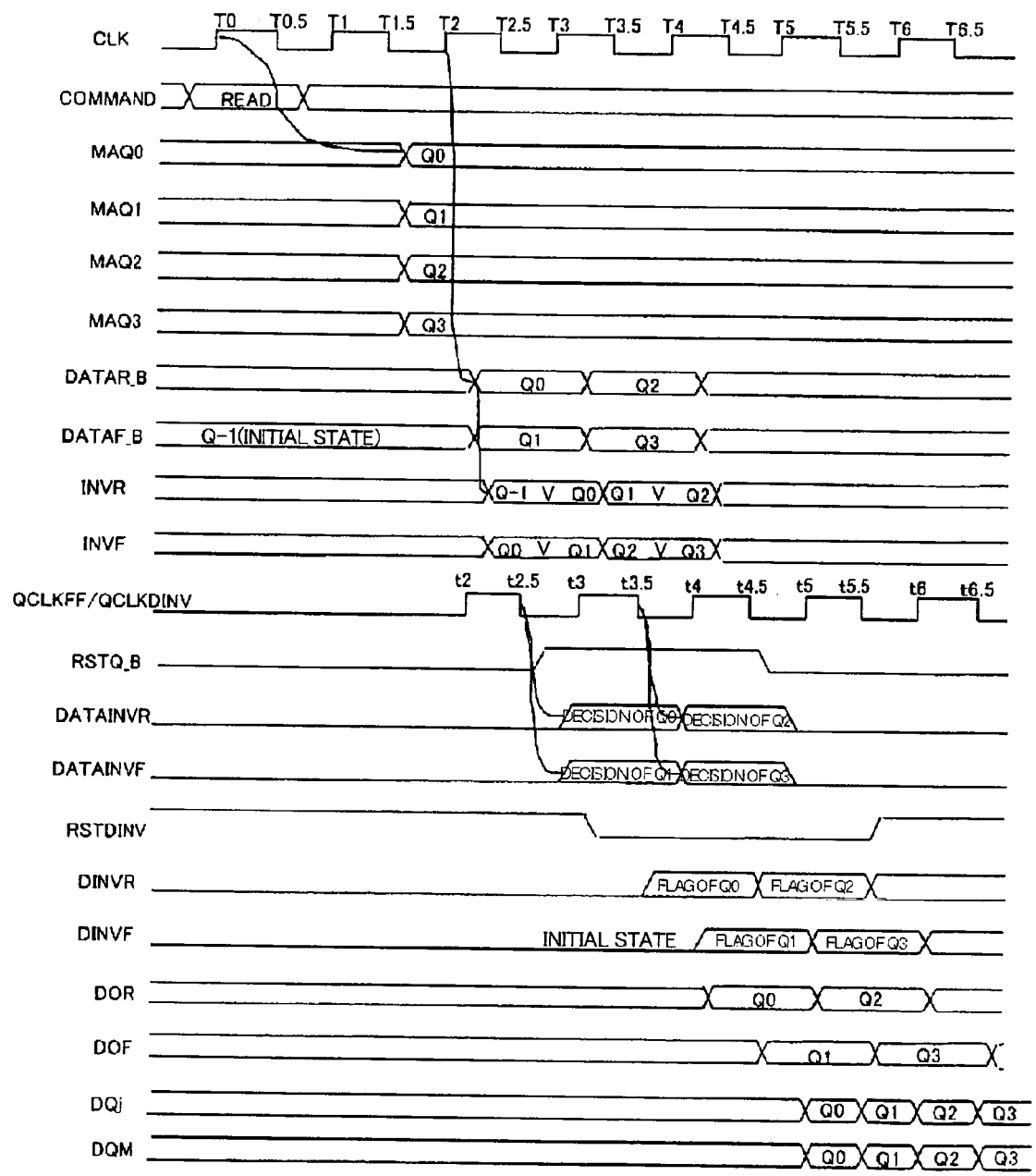
FIG. 5 depicts a timing chart showing the operation of signals shown in FIGS. 2 and 3.

The circuit operation of FIGS. 2 and 3 is now explained. FIG. 5 shows a timing chart of the operations of the circuits shown in FIGS. 2 and 3.

On receipt of a read command from a circuit, not shown, at a timing T0 of the clock signal (CLK) (COMMAND is READ), the main amplifiers 11 to 14 output delayed 4-bit data (Q0 to Q3) as signals MAQ0 to MAQ3. The signals MAQ0 and MAQ2 are then arrayed serially through the parallel-to-serial conversion circuit 15 and the bus driver 16 so as to be output as a signal DATAR_B, while the signals MAQ1 and MAQ3 are arrayed serially through the parallel-to-serial conversion circuit 15 and the bus driver 17 so as to be output as a signal DATAF_B.

The data Q0 and Q1 are output in the signals DATAR_B and DATAF_B at a timing T2 of the clock signal CLK, respectively, while the data Q2 and Q3 are output in the signals DATAR_B and DATAF_B at a timing T3 of CLK, respectively. It is noted that, for the signal DATAF_B, a data Q-1 (initial state) is output before a timing of T2 of the clock signal CLK.

The signal DATAR_B is supplied to the latency latch circuit 18 and to the data comparator circuits 211 and 212, while the signal DATAF_B is supplied to the latency latch circuit 18 and to the data comparator circuits 212. The signal DATAR_B, supplied to the latency latch circuit 18, is delayed by approximately 1.5 clocks, by the D-latch circuit 1803, inverter circuit 1804 and by the D-flip-flop circuit 1805 and supplied as a signal DATAR3 to the data inversion circuit 511.

The signal DATAF_B, supplied to the latency latch circuit 18, is output as a signal delayed by approximately one clock DATAF2_B, through the D-latch circuit 1806, NAND circuit 1807 and the D-latch circuit 1808, while being delayed by approximately two clocks by the D-latch circuits 1809 and 1810 and the inverter circuit 1811, so as to be supplied as a signal DATAF3 to the data inverting circuit 512. When the signal RSTQ_B at a low level is supplied to the NAND circuit 1807, the D-latch circuits 1808 to 1810 are initialized.

On the other hand, the signals DATAR_B and DATAF2_B are supplied to the data comparator circuit 211 so as to be processed with Ex-OR by the inverter circuits 2111, 2112 and by the selection circuit 2113 for data comparison.

That is, by the signal DATAR_B being supplied to a terminal S of the selection circuit 2113, by the signal DATAR_B being inverted (logically negated) by the inverter circuit 2111 and then being supplied to the terminal /S of the selection circuit 2113, by the signal DATAF2_B being supplied to the terminal A of the selection circuit 2113 and by the signal DATAF2_B being inverted (logically negated) by the inverter circuit 2112 and then being supplied to the terminal B of the selection circuit 2113, the Ex-OR operation by the logic equation of

/Y=DATAF2_B·/DATAR_B+/DATAF2_B·DATAR_B is carried out to compare the signal DATAF2_B to the signal DATAR_B, and the result of comparison is output to a terminal /Y of the selection circuit 2113. That is, in case the logic values of the DATAF2_B and the signal DATAR_B are not coincident to each other, the terminal /Y is high and is output as a signal INVR. It is noted that /, · and + denote logical negation, logical product and the logical sum, respectively.

The result of the data comparison is supplied as signal INVR from the data comparator circuit 211 to the majority decision circuit 311.

On the other hand, the signal DATAR_B and DATAF_B, supplied to the data comparator circuit 212, are processed with Ex-OR by the inverter circuits 2121 and 2122 and by the selection circuit 2123 by way of data comparison. That is, the processing equivalent to the processing with Ex-OR, described above, is carried out and the result of the data comparison is supplied as a signal INVF from the data comparator circuit 212 to the majority decision circuit 312.

N comparison signals INVR are supplied to the majority decision circuit 311 associated with the rising side, while N comparison signals INVF are supplied to the majority decision circuit 312 associated with the falling side. The majority decision circuit 311 checks to see whether or not one-half or more of the input data have been switched, that is whether or not the number of the high level comparison signals is not less than N/2. If the number is not less than N/2, a high level signal is output as the majority decision signal DATAINVR. Also, the majority decision circuit 312 checks to see whether or not one-half or more of the input data have been switched, that is whether or not the number of the high level comparison signals is not less than N/2. If the number is not less than N/2, a high level signal is output as the majority decision signal DATAINVF. It is noted that any suitable known majority decision circuit may be used as the majority decision circuits 311, 312.

The majority decision signal DATAINVR and the inversion flag signal DINVF are processed with Ex-OR by the inverter circuit 4001 and the selection circuit 4002 by way of data comparison. The processing operation equivalent to the Ex-OR described above is carried out and the result of data comparison is delayed by approximately one clock by the edge triggered D-flip-flop circuit 4003 and the inverter circuit 4004 and output as a signal DINVR.

The majority decision signal DATAINVF, delayed by approximately 0.5 clock by the D-latch circuit 4006, are processed with Ex-OR by the inverter circuit 4007 and the selection circuit 4008 for data comparison. The processing operation equivalent to the Ex-OR described above is carried out and the result of data comparison is delayed by approximately one clock by the NOR circuit 4009, edge triggered D-flip-flop circuit 4010 and the inverter circuit 4011 and output as a signal DINVF. Meanwhile, when the high level signal RSTDINV is supplied to the NOR circuit 4009, the edge triggered D-flip-flop circuit 4010 is initialized.

The inversion flag signal DINVR and the signal DATAR3 are processed with Ex-OR by the inverter circuit 5111 and the selection circuit 5112 in the data inverting circuit 511, so that, when the inversion flag signal DINVR is high, an inverted signal of the signal DATAR3 is output as the signal DOR. That is, the data Q0 of the signal DATAR_B is delayed by approximately two clocks and is presented as the data Q0 of the signal DOR or as the data Q0 inverted in logic state. Similarly, the data Q2 of the signal DATAR_B is delayed by approximately two clocks and is presented as the data Q2 of the signal DOR or as the data Q2 inverted in logic state.

The inversion flag signal DINVF and the signal DATAF3 are processed with Ex-OR by the inverter circuit 5121 and the selection circuit 5122 in the data inversion circuit 512, such that, when the inversion flag signal DINVF is high, an inverted signal of the signal DATAF3 is output as the signal DOF. That is, the data Q1 of the signal DATAF_B is delayed by approximately 2.5 clocks and is presented as data Q1 of the signal DOF or as the data Q1 with the inverted logic state. Similarly, the data Q3 of the signal DATAF_B is delayed by approximately 2.5 clocks and is presented as data Q3 of the signal DOF or as the data Q3 with the inverted logic state.

The data Q0, Q2 of the signal DOR and the data Q1, Q3 of the signal DOF are arrayed by the parallel to serial conversion circuit 71 as serial data and are serially output from the output pin 73 as signal DQj by the output buffer circuit 72.

The flags of the data Q0 and Q2 of the inversion flag signals DINVR and the flags of the data Q1 and Q3 of the inversion flag signals DINVF are arrayed by the parallel to serial conversion circuit 61 as serial data output serially, and are output from the output pin 63 as a signal DQM by the output buffer circuit 62.

Taking an instance of specified numerical data, changes in the respective signals are explained. FIG. 6 shows an instance of the changes in the respective signals in the data inverting circuit of the first embodiment of the present invention.

As a specified example, such a case is scrutinized in which four 8-bit data, namely "11111111", "00000000", "11111111" and "00000000" (Q0, Q1, Q2 and Q3, respectively) are sequentially consecutively read from a memory. The respective signals DATAR_B and DATAF_B, output from the bus drivers 16, 17, are inverted signals of the read data from the memory. However, it is assumed that, in the following explanation, non-inverted signals DATAR, DATAF are being output, only for clarity sake.

If, in the cycle of reading out the data Q0, Q1, the value "11111111" of the rising side signal DATAR and the initial state "00000000" of the falling side signal DATAF are compared (Ex-ORed) to each other, all of the eight bits have been switched. Thus, "11111111" is output as a rising side comparison flag signal INVR. On the other hand, if the value "00000000" of the falling side signal DATAF is compared to the value "11111111" of the rising side signal DATAR, all of the eight bits have been switched. Thus, "11111111" is output as a falling side comparison flag signal INVF. Since eight bits have been switched, the majority decision signals DATAINVR and DATAINVF are both at a high level (High).

The rising side majority decision signal DATAINVR (high level) and the initial value (low level) of the inversion flag signal DINVF for the falling side data are processed with Ex-OR so that a high level (High) signal is output as the inversion flag signal DINVR for the rising side data. The falling side majority decision signal DATAINVF (high level) and the inversion flag signal DINVR for the rising side data (high level) are processed with Ex-OR so that a low level signal is output as the inversion flag signal DINVF for the falling side data.

Since the inversion flag signal DINVR for the rising side data is at a high level, the data "11111111" in the cycle Q0 is inverted and "00000000" is output as the signal DQj, whilst a flag signal (high level) indicating the fact of data inversion is output as DQM.

Since the inversion flag signal DINVF for the falling side data is at a low level, the data "00000000" in the cycle Q1 is output as "00000000" in the signal DQj, without inversion, and flag signal (low level) indicating the fact of data non-inversion is output as DQM.

In similar manner, in the cycle of reading out the data Q2, Q3, the result of comparison (Ex-OR) of the rising side signal DATAR "11111111" and the falling side value "00000000" of the previous cycle indicates that 8 bits have all been switched. Thus, "11111111" is output as the rising side comparison flag signal INVR. Moreover, the result of comparison of the value of the falling side signal DATAF "00000000" and the value of the rising sides signal DATAF "11111111" indicates that 8 bits have all been switched. Thus, "11111111" is output as the falling side comparison flag signal INVF.

Since the eight bits have been switched, the majority decision signals DATAINVR, DATAINVF are both at a high level. The rising side majority decision signal DATAINVR (high level) and the value of the inversion flag signal (low level) for the falling side data of the previous cycle are processed with Ex-OR so that a high level inversion flag signal DINVR is output as the rising side data. The majority decision signal DATAINVF (high level) on the falling side and the inversion flag signal DINVR (high level) for the rising side data are processed with Ex-OR so that a low level inversion flag signal DINVF is output for the falling side data Since the inversion flag signal DINVR for the rising side data is at a high level, the data "11111111" in the cycle Q2 is inverted and "00000000" is output as the signal DQj, whilst a flag signal (high level) indicating the fact of data inversion is output as DQM.

Since the inversion flag signal DINVF for the falling side data is at a low level, the data "00000000" in the cycle Q3 is output as the signal DQj, without inversion, and a flag signal (low level), indicating the fact of data non-inversion, is output as DQM.

In the above explanation, the data comparator circuits 211, 212 are supplied not with data actually output to outside at the output pin 73 in the data comparison, but with data which are internal signals DATAR_B, DATAF_B and DATAF2_B. Thus, the output signals of the majority decision circuits 311, 312 are not coincident with the signals DINVR, DINVF indicating whether or not data is to be actually inverted.

Consequently, the inversion flag generating circuit 40 processes the output signal of the majority decision circuit 311 and the inversion flag signal DINVF of the previous cycle with Ex-OR to yield signals DINVR, DINVF indicating whether or not data is to be inverted.

In the data inversion circuit of the first embodiment of the present invention, constructed as described above, the four data, read at a time from the memory array by e.g. a pre-fetch operation, are divided into data associated with the rising side of the clock signal and data associated with the falling side of the clock signal, and a parallel operation is caused to occur in one clock cycle for the respective data, thus assuring facilitated timing designing in implementing the data inversion circuit, operating in stability, thus allowing the provision of the data inversion circuit convenient for e.g. the DDR-SDRAM.

[Embodiment 2]

Figure 7:
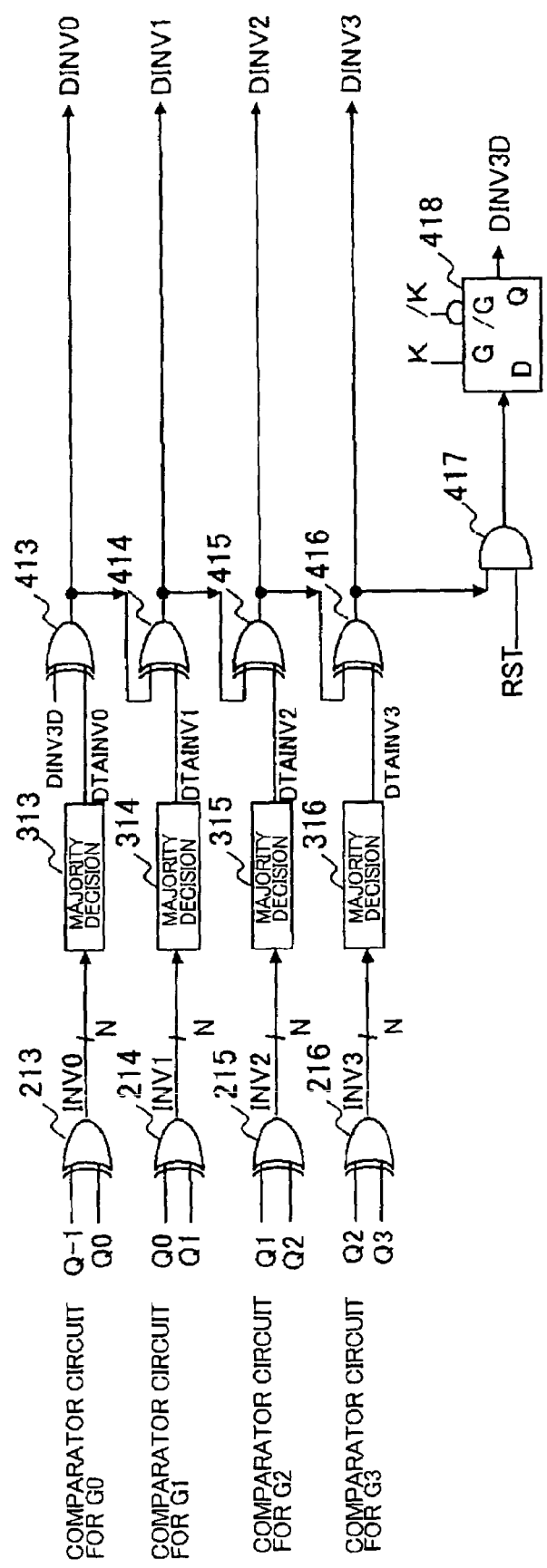
FIG. 7 is a block diagram showing a configuration of a data inversion circuit according to a second embodiment of the present invention.
Figure 8:
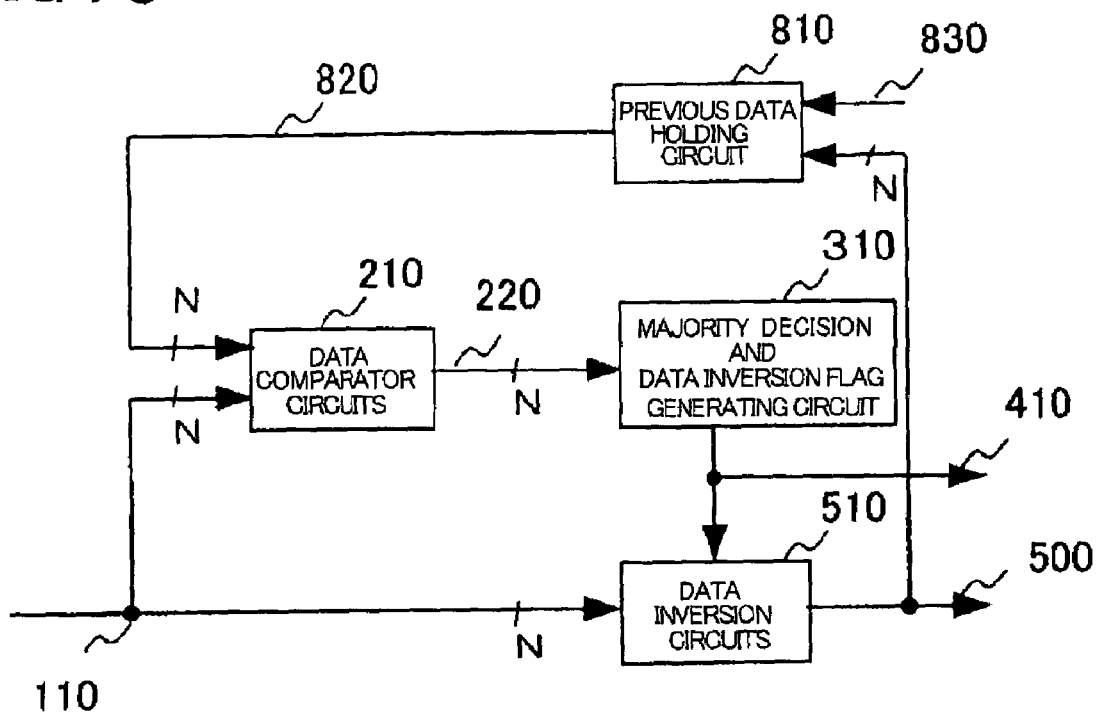
FIG. 8 is a block diagram showing a configuration of a conventional data inversion circuit.

FIG. 7 is a block diagram showing the configuration of a data inversion circuit according to a second embodiment of the present invention, with P=4. FIG. 7 shows the connection of plural blocks of a data comparator circuit, a majority decision circuit and an inversion flag generating circuit, as major portions of the data inversion circuit, and thus depicts an illustrative circuit structure having four serial channels or paths.

There are provided exclusive-OR (Ex-OR) circuits 213, 214, 215 and 216, corresponding to data comparator circuits, and which are present in association with a preset one bit of N-bit parallel data, where N is an integer not less than 2. There are also provided exclusive-OR (Ex-OR) circuits 413, 414, 415 and 416, corresponding to the inversion flag generating circuit. A D-latch circuit 418 holds the inversion flag signal DINV3, output by the Ex-OR circuit 416, by a timing circuit, not shown, or by clock signals K, supplied by the timing circuit or the clock circuit, not shown. An output signal DINV3D of the D-latch circuit 418 is supplied to the Ex-OR circuit 413. The AND circuit 417 also initializes the D-latch circuit 418 by setting the reset signal RST to a low level.

The processing of the data signal is now explained. It is presupposed that 4-bit pre-fetched data, transmitted serially, are input as the data Q0 to Q3.

The Ex-OR circuit 213 compares data Q-1 of the initial state (or data Q3 of the directly previous cycle) to data Q0, and outputs a comparison flag signal INV0, as a logic value, indicating whether or not the data are coincident with each other. The Ex-OR circuit 214 compares data Q0 to data Q1 and outputs a comparison flag signal INV1 as a logic value indicating whether or not the data are coincident with each other. The Ex-OR circuit 215 also compares data Q1 to data Q2 and outputs a comparison flag signal INV2 as a logic value indicating whether or not the data are coincident with each other. Moreover, the Ex-OR circuit 216 also compares data Q2 to data Q3 and outputs a comparison flag signal INV3 as a logic value indicating whether or not the data are coincident with each other.

An N-bit equivalent comparison flag signal INV0 is supplied to the majority decision circuit 313. This majority decision circuit 313 checks to see if the number of non-coincident ones of the N logic values is larger than the preset number, and outputs the result of decision as a logic value as a majority decision signal DTAINV0. In the present embodiment and in the following description, the preset number may e.g. be N/2 or an integer ahead or in rear of N/2.

An N-bit equivalent comparison flag signal INV1 is supplied to the majority decision circuit 314. This majority decision circuit 314 checks to see if the number of non-coincident ones of the N logic values is larger than the preset number, and outputs the result of decision as a logic value as a majority decision signal DTAINV1. An N-bit equivalent comparison flag signal INV2 is supplied to the majority decision circuit 315. This majority decision circuit 315 checks to see if the number of non-coincident ones of the N logic values is larger than the preset number, and outputs the result of decision as a logic value as a majority decision signal DTAINV2. An N-bit equivalent comparison flag signal INV3 is supplied to the majority decision circuit 316. This majority decision circuit 316 checks to see if the number of non-coincident ones of the N logic values is larger than the preset number, and outputs the result of decision as a logic value as a majority decision signal DTAINV3.

The Ex-OR circuit 413 compares the inversion flag signal DINV3D for the initial state or the previous cycle DINV3 to the majority decision signal DTAINV0, and outputs the inversion flag signal DINV0 as a logic value indicating whether or not the two signals coincide with each other. The Ex-OR circuit 414 compares the inversion flag signal DINV0 to the majority decision signal DTAINV1, and outputs the inversion flag signal DINV1 as a logic value indicating whether or not the two signals coincide with each other.

The Ex-OR circuit 415 compares the inversion flag signal DINV1 to the majority decision signal DTAINV2 and outputs the inversion flag signal DINV2 as a logic value indicating whether or not the two signals coincide with each other. The Ex-OR circuit 416 compares the inversion flag signal DINV2 to the majority decision signal DTAINV3 and outputs the inversion flag signal DINV3 as a logic value indicating whether or not the two signals coincide with each other. Meanwhile, the inversion flag signal DINV3 is held via AND circuit 417 by the D-latch 418 and is output as the inversion flag signal DINV3D of the next cycle.

In the above-described circuit structure, in which four data are processed in parallel, decision of data inversion needs to be carried out only once per two cycles of the clock signal. This assures facilitated timing designing in implementing a data inversion circuit which may be in operation in stability even with the high clock signal frequency.

Although the present invention has been described in connection with the preferred embodiments, it is to be noted that the present invention is not limited to the embodiment described and that various modifications or corrections which may be made by those skilled in the art within the scope of the appended claims may be included in the present invention.

The meritorious effects of the present invention are summarized as follows.

With the data inversion circuit according to the present invention, in which there are provided plural channels or paths of processing circuits and in which decision on data inversion may be carried out in parallel, the timing designing in implementing the data inversion functions may be facilitated. Moreover, by applying the data inversion circuit of the present invention to a semiconductor device (DDR-SDRAM) having the double data rate function, timing designing in implementing the data inversion functions may be facilitated even if the frequency of the clock signals is increased.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device having a data inversion function in which data of a given cycle is compared with output data of a directly previous cycle to verify whether or not a majority in total bits constituting the data are switched and in which, when the majority number of bits of the data are switched, the data of said given cycle are inverted and the inverted data are output from a plurality of output terminals, said semiconductor device comprising:

a plurality of data comparator circuits, each being provided in associated one of a plurality of paths on which a plurality of data are transferred in parallel, with an output sequence from the output terminal between said plurality of data being predetermined, and comparing temporally before and after data;

a plurality of majority decision circuits, each receiving a plurality of comparison results which are output by the corresponding data comparator circuit, and the number of which corresponds to the number of said output terminals, and performing a majority decision of the comparison results received to output a decision result; and a plurality of inversion flag generating circuits, each receiving the decision result from the corresponding majority decision circuit and generating an inversion flag indicating that data is inverted and is output from said output terminals, based on the decision result;

wherein the decisions of data inversion for a plurality of cycles are made in parallel.

2. The semiconductor device according to claim 1, wherein one circuit group made up of said data comparator circuit, said majority decision circuit and said inversion flag generating circuit are provided for a path on which data prescribed by a rising edge of double-rate clock signal is transferred and another circuit group made up of said data comparator circuit, said majority decision circuit and said inversion flag generating circuit are provided for a path on which data prescribed by a falling edge of the double-rate clock signal is transferred.

3. A semiconductor device comprising:

a plurality of data output terminals;

first to P-th ports for one of said output terminals, for outputting, in parallel, first to P-th bit data to be output via said one data output terminal, where P is a predetermined integer not less than two, said first to the P-th bit data being output in this order via each data output terminal;

first to P-th data comparator circuits provided in association with said first to P-th ports, an i-th data comparator circuit of said data comparator circuits, where i is an integer from 1 to P, comparing data of the (i−1)st port, where if i=1, (i−1)st port is the P-th port or an initial value, with data of the i-th port to output an i-th comparison flag signal, first to P-th majority decision circuits provided in association with first to P-th data comparator circuits, the i-th majority decision circuit of said majority decision circuits, where i is an integer from 1 to P, receiving the i-th comparison signal, a number of which is equal to the number of the data output terminals of the semiconductor device and checking whether or not number of non-coincidence is the majority;

first to P-th inversion flag generating circuits provided in association with said majority decision circuits, the i-th inversion flag generating circuit of said first to P-th inversion flag generating circuits, where i is an integer from 1 to P, comparing an inversion flag signal of the (i−1)st one of said ports, where if i=1, (i−1)st port is the P-th port or an initial value, with the result of decision of the i-th majority decision circuit to output an i-th inversion flag signal; and first to P-th data inversion circuits for controlling inversion of associated data based on the associated inversion flag signal, the i-th data inversion circuit of said data inversion circuits, where i is an integer from 1 to P, inverting data on said i-th port, thereby for the inverted data to be output from said data output terminal, if said i-th inversion flag signal indicates the inversion.

4. The semiconductor device according to claim 3, wherein the data of said first to P-th ports are sequenced, for said one data output terminal, in the order of the first port up to the P-th port, so that the data are serially converted and output.

5. A semiconductor device in which data are output twice from one data terminal during each clock cycle, based on a transition of the clock signal from a first logic value to a second logic value and a transition of the clock signal from said second logic value to said first logic value, said semiconductor device comprising:

first and second data comparator circuits, connected to first and second paths, respectively, the data output on a first transition of said clock signal from the first logic value to the second logic value and on a second transition thereof from the second logic value to the first logic value being transmitted on said first and second paths, respectively;

said first data comparator circuit verifying, by comparison, whether or not the data in a first transition timing of said clock signal on said first path is coincident with the data in a second transition timing of said clock signal directly previous to said first transition timing, on said second path to decide the presence or absence of data switching between said second transition directly previous to said first transition and said first transition and outputting the result of decision as a first output signal;

said second data comparator circuit verifying, by comparison, whether or not the data in the first transition timing of said clock signal on said first path is coincident with the data in the second transition timing of said clock signal next following said first transition timing, on said second path to decide the presence or absence of data switching between said first transition and the second transition next following to said first transition, and outputting the result of decision as a second output signal;

a first majority decision circuit, receiving a first group of output signals, which are output from said first data comparator circuit, and the number of which is equal to the data terminals of the semiconductor device, and verifying whether or not the majority of the data in said first group of the output signals have been switched to output a first decision result signal;

a second majority decision circuit, receiving a second group of output signals, which are output from said second data comparator circuits and the number of which is equal to the data output terminals of the semiconductor device, and verifying whether or not the majority of the data in said second group of the output signals have been switched to output a second decision result signal;

a first inversion flag generating circuit for generating a first inversion flag from said first decision result signal output from said first majority decision circuit and from the value of a second inversion flag previous at least by one transition of said clock signal;

a second inversion flag generating circuit for generating the second inversion flag from said second decision result signal from said second majority decision circuit and from the value of said first inversion flag previous at least by one transition of said clock signal;

a first data inversion circuit for inverting the data of said first path and outputting the resulting inverted data, if the first inversion flag indicates that the majority of the data have been switched; and a second data inversion circuit for inverting the data of said inversion flag indicates that the majority of the data have been switched;

wherein said first and second inversion flag generating circuits output said first and second inversion flag signals respectively, as flags indicating the inversion of the output data, from a control terminal of the semiconductor device.

6. The semiconductor device according to claim 5, wherein said first and second data comparator circuits and the first and second data inversion circuits are provided in a stage of a latch circuit unit provided on a data bus on which data of said first and second paths are transferred to an output circuit.

7. The semiconductor device according to claim 5, further comprising:
a parallel-to-serial conversion circuit, receiving outputs from said first and second data inversion circuits in parallel, and performing parallel to serial conversion of said outputs to output the resulting serial data; and
an output buffer circuit receiving the output data from said parallel-to-serial conversion circuit to output the data from an output terminal.

8. The semiconductor device according to claim 6, wherein said latch circuit unit comprises:
first and second latch circuits connected to said first and second paths respectively, for sampling and outputting the first and second data, output to said first and second paths in parallel, with the first and second transitions of a first sampling clock signal, respectively;
a third latch circuit for sampling the output of said first latch circuit with one of the first and second transitions of the first sampling clock signal and for outputting the sampled signal with the other transition of the first sampling clock signal;
a fourth latch circuit, receiving an output of said second latch circuit, for sampling and outputting the signal with said one of the first and second transitions of said first sampling clock signal;
a fifth latch circuit, receiving an output of said fourth latch circuit, for sampling and outputting the signal with said one of the first and second transitions of said first sampling clock signal; and
a sixth latch circuit, receiving an output of said fifth latch circuit, for sampling and outputting the signal with the other of the first and second transitions of said first sampling clock signal.

9. The semiconductor device according to claim 8, wherein said first data inversion circuit comprises a first selection circuit receiving an output of said third latch circuit and an inverted signal thereof, and also receiving said first inversion flag signal, as a selection control signal, said first selection circuit outputting said inversion signal when said first inversion flag signal indicates inversion; and wherein
said second data inversion circuit comprises a second selection circuit receiving an output of said sixth latch circuit and an inverted signal thereof, and also receiving said second inversion flag signal, as a selection control signal, said second selection circuit outputting said inversion signal when said second inversion flag signal indicates inversion.

10. The semiconductor device according to claim 8, wherein said first data comparator circuit receives data of said first path and an output of said fourth latch circuit for detecting a coincidence thereof; and wherein said second data comparator circuit receives data of said first and second paths for detecting a coincidence thereof.

11. The semiconductor device according to claim 8, wherein said first inversion flag generating circuit includes a first comparator circuit for checking whether or not said first check result signal from said first majority decision circuit coincides with said second inversion flag from said second inversion flag generating circuit; and
a seventh latch circuit for sampling an output of said first comparator circuit with one of the first and second transitions of a second sampling clock signal and outputting the output with the other transition of the second sampling clock signal; and wherein
said second inversion flag generating circuit includes an eighth latch circuit for sampling and outputting said second check result signal from said second majority decision circuit with the other of said first and second transitions of said second sampling clock signal;
a second comparator circuit for checking whether or not said first inversion flag from said first inversion flag generating circuit is coincident with an output of said eighth latch circuit; and
a ninth latch circuit for sampling an output of said eighth comparator circuit with one of the first and second transitions of said second sampling clock signal and for outputting the sampled output with the other transition of said second sampling clock signal.

12. The semiconductor device according to claim 8, further comprising means for resetting said fourth latch circuit.

13. The semiconductor device according to claim 11, further comprising means for resetting said ninth latch circuit.

14. The semiconductor device according to claim 11, wherein said first and second sampling clock signals are both generated by the clock signal supplied from outside the semiconductor device to the semiconductor device and are synchronized with each other.

15. The semiconductor device according to claim 11, further comprising a clock synchronized type semiconductor memory for outputting read data from a cell array at a timing of a rising edge and a falling edge of a clock signal, wherein read data from the cell array of said semiconductor memories is output at a rising edge and at a falling edge of the clock signal.

16. A data inversion circuit for outputting parallel data composed by N bits, where N is an integer not less than two, said data inversion circuit comprising:
N sets of first to P-th data comparator means, in association with said N bits,
said first to P-th data comparator means classifying said parallel data into P sets of parallel data neighboring to one another in the outputting timing sequence, P being an integer not less than two, said first to P-th data comparator means comparing the logic value of each of the first to P-th parallel data with the logic value of the parallel data to be output temporally directly previously to said first to P-th parallel data, at the same bit positions as those of the first to P-th parallel data, and outputting a comparison result as a logic value indicating coincidence or non-coincidence;
first to P-th majority decision means, p-th majority decision means of said majority decision means, where p is an integer from not less than 1 to not larger than P, verifying whether or not the number of non-coincident ones of N logic values output from said P-th data comparator means of one of said N sets is larger than a preset number and outputting a decision result as a logic value;
first to P-th inversion flag generating means, p-th majority decision means of said inversion flag generating means, where p is an integer from not less than 1 to not larger than P, deciding whether or not there is a coincidence of an output logic value of the (p−1)st inversion flag with an output logic value of said p-th majority decision means, and outputting the logic value of the decision result as a p-th inversion flag;
data holding means holding output logic value of said P-th inversion flag generating means;
said first inversion flag generating means deciding whether or not there is a coincidence of an output logic value of said P-th inversion flag generating means, held by the data holding means, with an output logic value of said first majority decision means, and outputting the logic value of the decision result as a first inversion flag;

N sets of first to P-th data inversion means, in association with said N bits, said first to P-th data inversion means inverting the logic values in respective bit positions of said first to P-th parallel data responsive to said first to P-th inversion flags;

flag outputting means, receiving said first to P-th inversion flags in parallel output from said first to P-th inversion flag generating means and performing parallel to serial conversion of the inversion flags received to output serially the resultant inversion flag in a predetermined timing sequence; and N sets of data outputting means, in association with said N bits, each data outputting means performing receiving output data signals in parallel from said first to P-th data inverting means and performing parallel to serial conversion of the signals received to output the resulting output data from the associated output terminal synchronized with the timing sequence of said inversion flags output by said flag outputting means.

17. A data inversion circuit according to claim 16, wherein at least one of said data comparator means, majority decision means, inversion flag generating means, data inverting means, flag outputting means and said data outputting means is operated in synchronization with a clock signal and wherein the inversion flag output from said flag outputting means is synchronized with said clock signal and data output from said data outputting means is synchronized with said clock signal.

18. The data inversion circuit according to claim 16, wherein at least one of said data comparator means, majority decision means, inversion flag generating means, data inverting means, flag outputting means and said data outputting means is operated in synchronization with rise and fall timings of a clock signal and wherein the inversion flag output from said flag outputting means is in synchronized with the rise and fall timings of said clock signal and data output from said flag outputting means is synchronized with the rise and fall timings of said clock signal.

19. The data inversion circuit as claimed in claim 16, wherein the inversion flag output from said flag outputting means includes the information as to whether or not the data output from said data outputting means is data obtained by inverting a logic value of the original data supplied to the data inversion circuit.

20. The data inversion circuit according to claim 16, wherein said P is 2 or 4.

21. The data inversion circuit according to claim 16, wherein said preset number is N/2 or an integer close up thereon.

22. A semiconductor device having a data inversion circuit as defined in claim 16.

23. A semiconductor device comprising:
a memory cell array; and
the data inversion circuit as defined in claim 16; wherein the P is equal to 2; and wherein a plural number of data read at a time by a pre-fetch operation from the memory cell array are separated into data associated with a rise of a clock signal and data associated with a fall of the clock signal and said data inversion circuit receiving the separated data.

* * * * *